(12) United States Patent
Liu

(10) Patent No.: US 7,015,712 B1
(45) Date of Patent: Mar. 21, 2006

(54) PRODUCTION LINE ENVIRONMENTAL STRESS SCREENING SYSTEM

(76) Inventor: Hong-Sun Liu, 44291 View Point Cir., Fremont, CA (US) 94539

( * ) Notice: Subject to any disclaimer, the term of this patent is extended or adjusted under 35 U.S.C. 154(b) by 0 days.

(21) Appl. No.: 11/107,761

(22) Filed: Apr. 18, 2005

(51) Int. Cl.
*G01R 31/02* (2006.01)

(52) U.S. Cl. .................. 324/760; 324/765; 324/158.1; 219/209

(58) Field of Classification Search .............. None
See application file for complete search history.

(56) References Cited

U.S. PATENT DOCUMENTS 4,850,104 A * 7/1989 Matrone et al. .............. 29/829
6,046,421 A * 4/2000 Ho ............................. 209/573
6,943,541 B1 * 9/2005 Bruyn ....................... 324/158.1

* cited by examiner

*Primary Examiner*—Vinh Nguyen
*Assistant Examiner*—Jimmy Nguyen
(74) *Attorney, Agent, or Firm*—Rosenberg, Klein & Lee

(57) ABSTRACT

A production line environmental stress screening system consists of a shaker, a head expander, a fast ramping temperature chamber, two transporting trays, two PCB according fixture assemblies, a vacuum pump, a compressed air system, and a base table. The two PCB according fixture assemblies move back and forth and alternately enter the fast ramping temperature chamber to receive vibration and high and low temperature screening. This system will greatly reduce the screening time required, drastically increase the production efficiency and significantly reduce the screening cost.

16 Claims, 11 Drawing Sheets

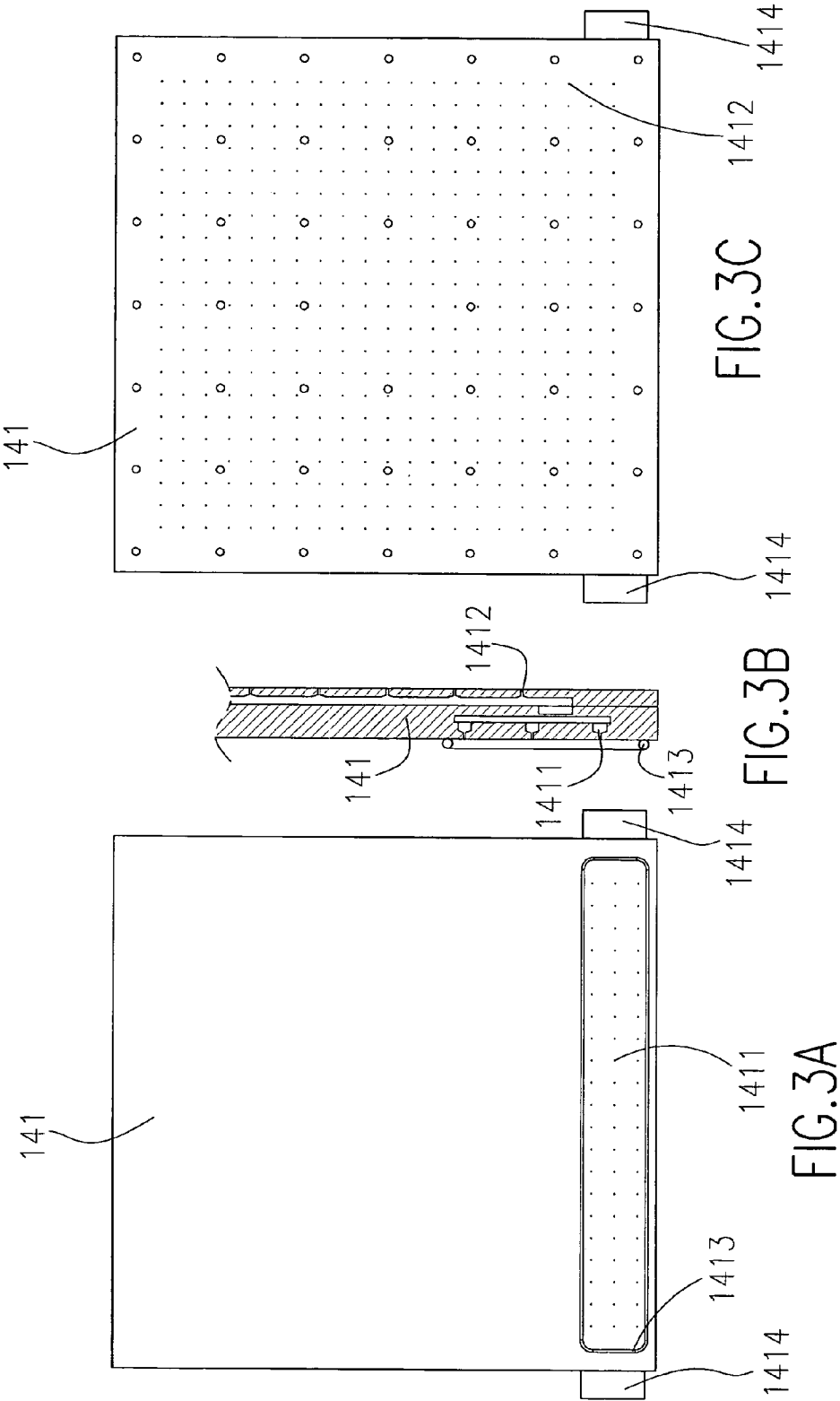

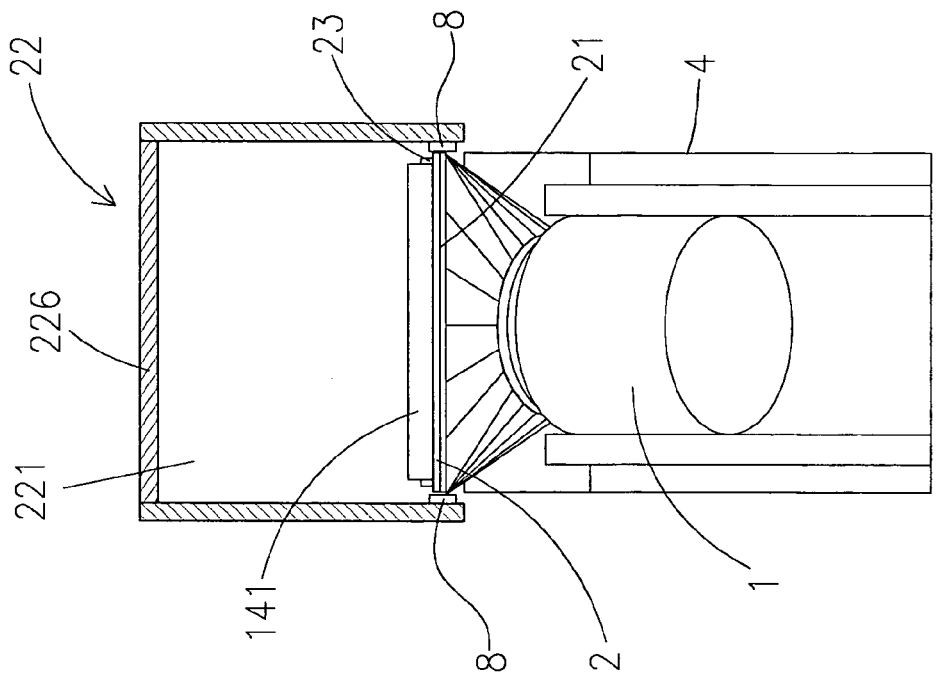
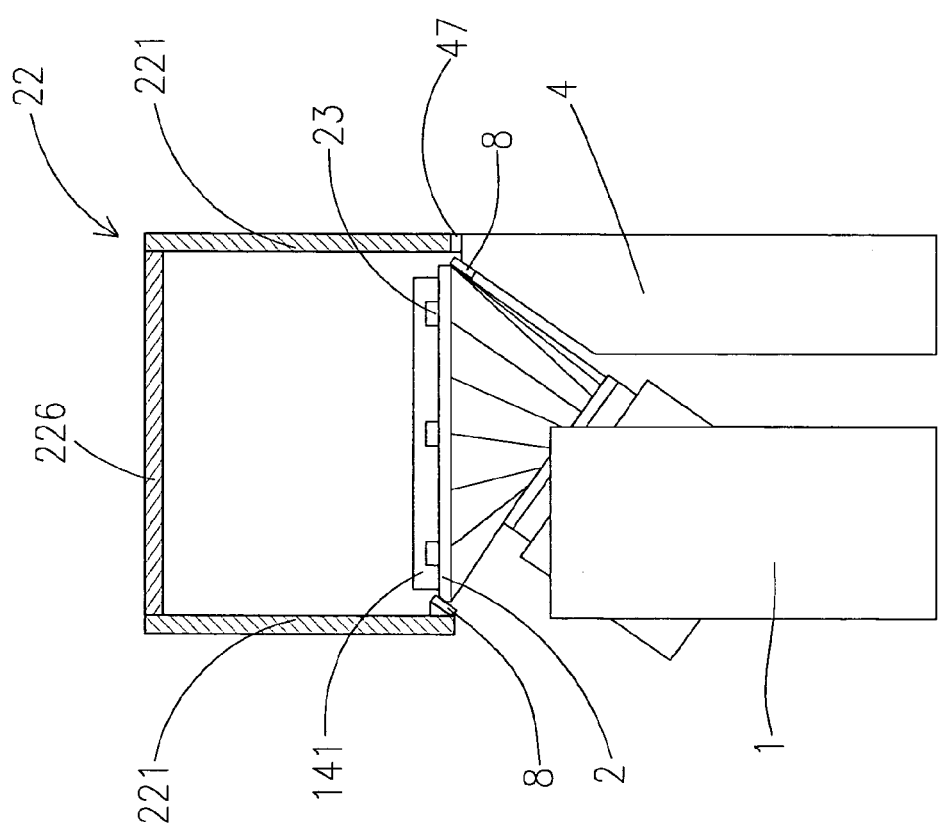
FIG. 4B
FIG. 4A

PRODUCTION LINE ENVIRONMENTAL STRESS SCREENING SYSTEM

BACKGROUND OF THE INVENTION

1. Field of the Invention

The present invention relates generally to environmental testing and, more particularly, to a new methodology and production line system for Environmental Stress Screening (ESS).

2. Description of the Prior Art

Manufacturers have observed that devices experience a high failure rate immediately after being placed in service, often referred to as "infant mortality," and near the end of their service life, often referred to as "old age." During a device's "mid-life" between infant mortality and old age, failure rates usually drop precipitously to a much lower level than those experienced during infant mortality and old age. Consequently, if before shipping a product a manufacturer can reliably and economically identify and eliminate particular sub-assemblies or parts in those devices that may suffer from infant mortality, the manufacturer can significantly improve the reliability of its products, while also significantly reducing its warranty expenses. Studies of devices which experience infant mortality have shown that most structures, subassemblies or components fail because of a latent defect introduced into the device at the design phase, or from components or processes used during its manufacture. Unfortunately, only after a device or component experiences stress in its normal operating environment does the latent defect reveal itself by the device's or component's failure.

Environmental Stress Screening (ESS) is a screening process applied to devices or components before they enter service to ensure they are free of defects. Old techniques employed in ESS involve subjecting the device or component to vibration while concurrently operating the device or component and recording its operation. More recently, advanced ESS processes involve continuously monitoring a device's, or component's operation while exposing it to multiple stresses, such as vibration, ultra-high rate temperature cycling, humidity, powering off and on, electrical voltage variation, load variation, etc.

Studies have shown that advanced ESS techniques can significantly increase the reliability of a product. However, these processes are both expensive and time consuming, thus reducing the product throughput, especially for large systems. There are two difficulties when applying ESS to a large system. First, the large system is very cumbersome to handle, and second, it is very difficult and expensive to achieve the ultra-high temperature ramp rates required for an effective ESS process. Because of these inherent drawbacks in current ESS equipment, most manufacturers do not include the ESS procedure in the manufacturing process. To eliminate these shortcomings, this invention has developed a new process concept and new equipment that will drastically reduce the time required for the ESS process, thus increasing the throughput and therefore significantly reducing the cost.

In a complex electronic system, most defects occur principally in structures, connectors and printed circuit boards with attached components. To identify potential structural and inter-connection problems of a system, the ESS process should be performed on the entire system, but only for one or two units. Because all of these problems are usually mechanical, once the design or manufacturing process is corrected, it will prevent them from happening again. Therefore, the majority of the remaining defects are associated with the PC boards or subassemblies. To simplify our explanation, only PC boards will be used as an example. The ESS process should be applied to as many of the PCBs as possible. As the size and weight of PC boards are much smaller and lighter than large hassis, handling of these PC boards will be facilitated and, ultra-high temperature ramp rates and uniform vibration will be much easier to achieve.

In summary, this new approach to the screening process is to perform ESS on one or two units of the entire system to find the structural and inter-connection problems, and then screen the PC boards to identify and remove the flawed units before they are assembled into the system. This approach will drastically increase the reliability of the system, but with much reduced cost and screening time.

Although the U.S. Pat. No. 5,650,569 obtained by this inventor can impart vibration in all three axes (X, Y, & Z) to a system or PC board, it is only good for screening one system or a few boards at a time and not as efficient for screening many systems or boards. Also, for large systems it is difficult to achieve high ramp rate temperature cycling. Therefore, we are submitting the new process and system for patent to alleviate these problems.

SUMMARY OF THE INVENTION

This invention is a production line ESS system. It employs a pair of accordion support structures that take turns moving onto a shaker head expander and into a fast ramping chamber. The system ramps quickly between high and low temperatures and vibrates at the extremes to simulate a "highly accelerated stress screening" on the product. This approach will drastically reduce the time and the cost of ESS, thus increasing the throughput and production.

BRIEF DESCRIPTION OF THE DRAWINGS

FIG. 3A is the top view of the transporting plate.

FIG. 3B is the cross sectional view of the transporting plate.

FIG. 3C is the bottom view of the transporting plate.

FIG. 4A is front view of the fast ramping temperature chamber and the shaker.

FIG. 4B is the side view of the fast ramping temperature chamber and the shaker.

DETAILED DESCRIPTION OF THE OREFERRED EMBODIMENT

Figure 1:
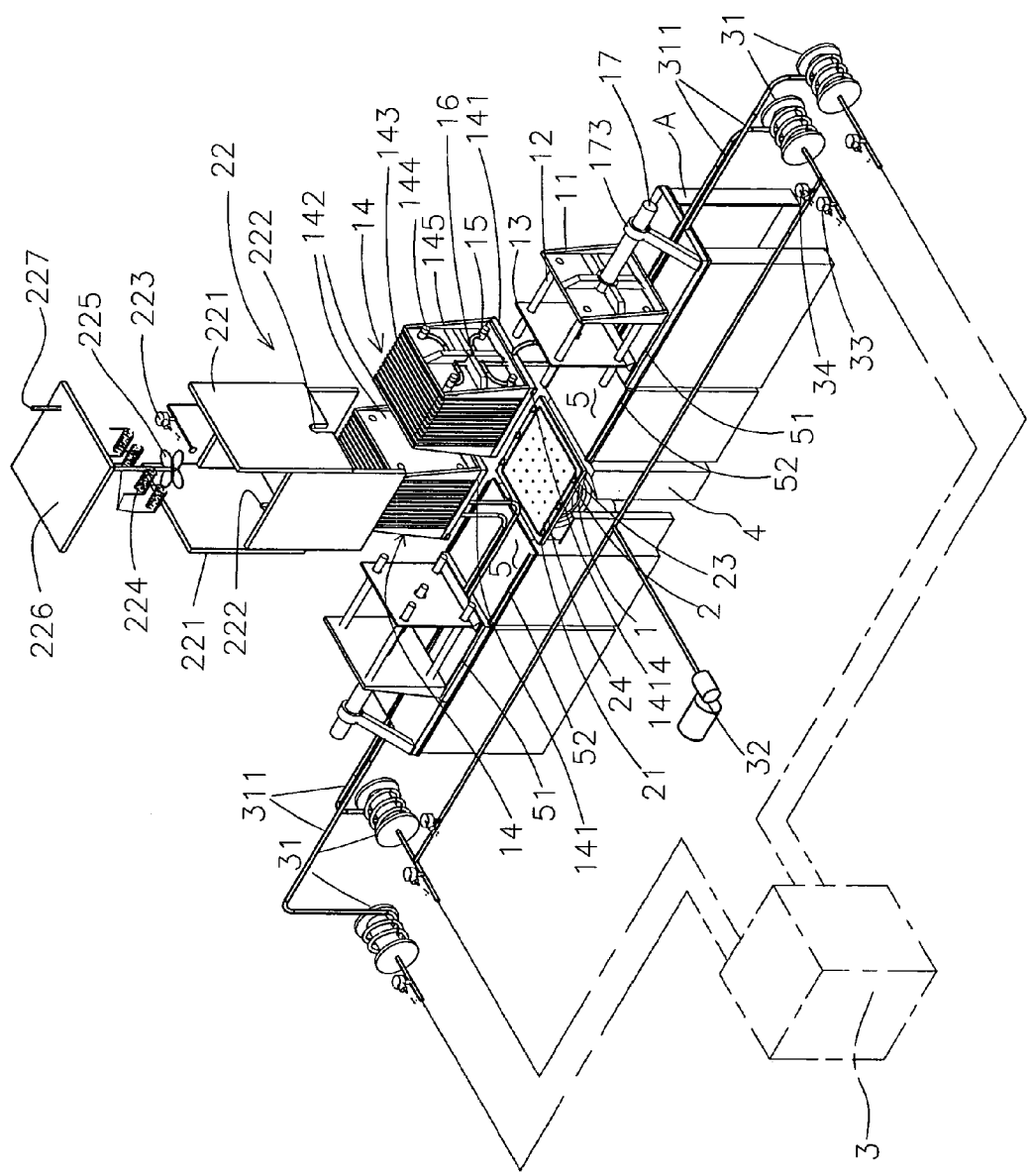
FIG. 1 is an exploded view of the production line environmental stress screening system according to the present invention.
Figures 5A, 5B, 5C:
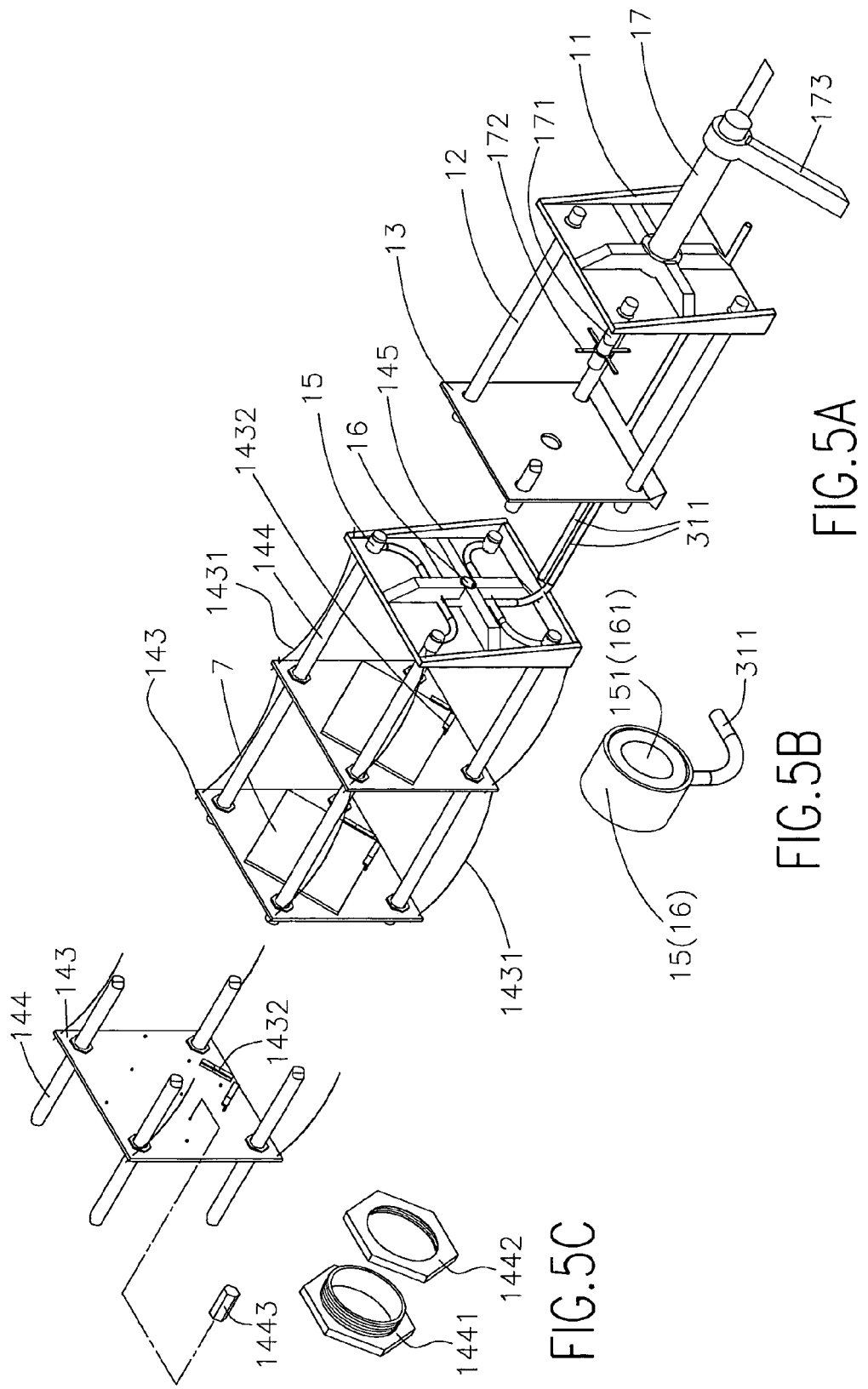
FIG. 5A is the exploded view of the accordion fixture assembly of the ESS system.
FIG. 5B is the enlarged view of the shaft collar lock.
FIG. 5C is the 3D enlarged view of the threaded sleeve and the nut.
Figure 6:
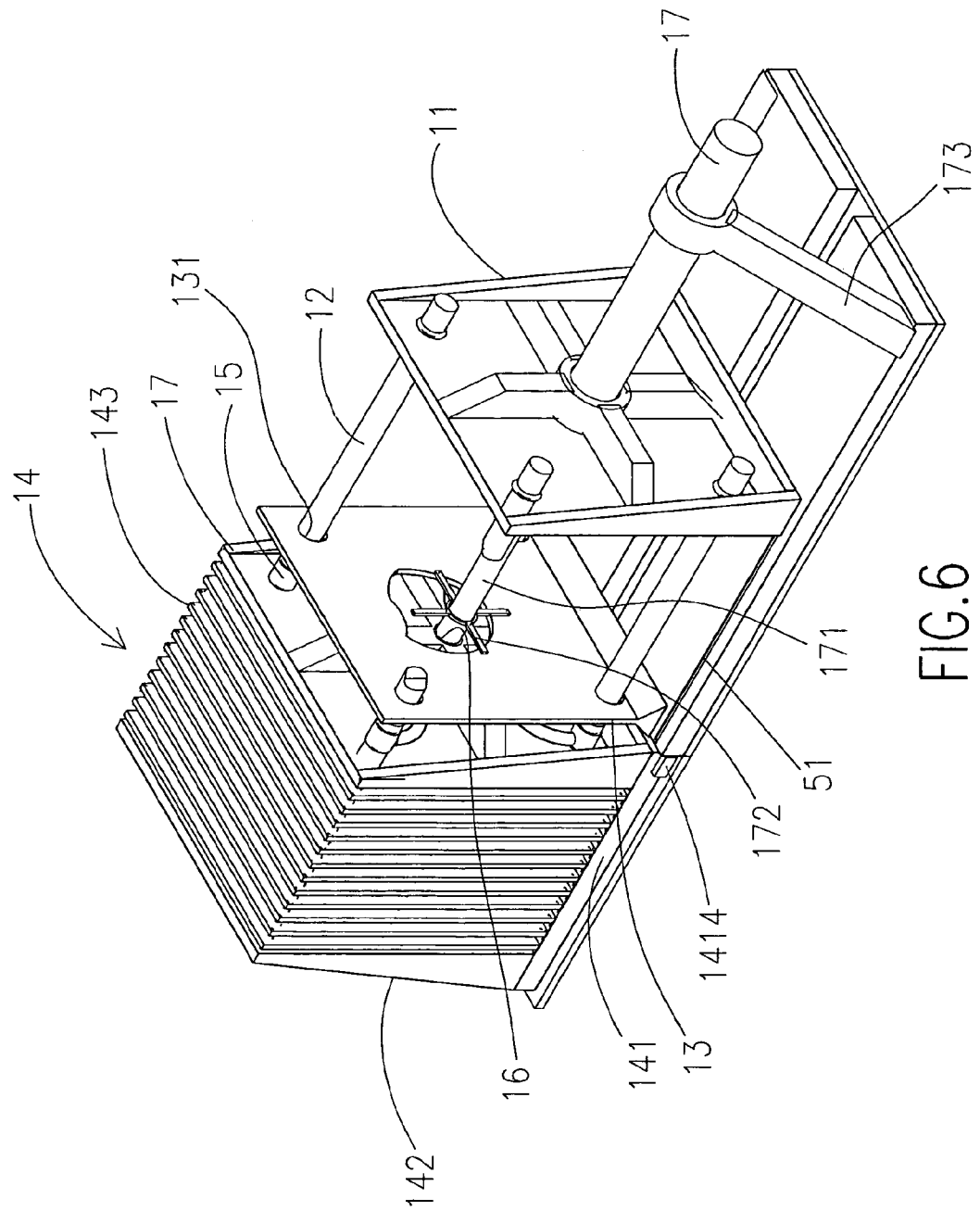
FIG. 6 shows one of the accordion fixture assemblies pushed together by the pneumatic piston and moving to the assembly table.
Figure 7:
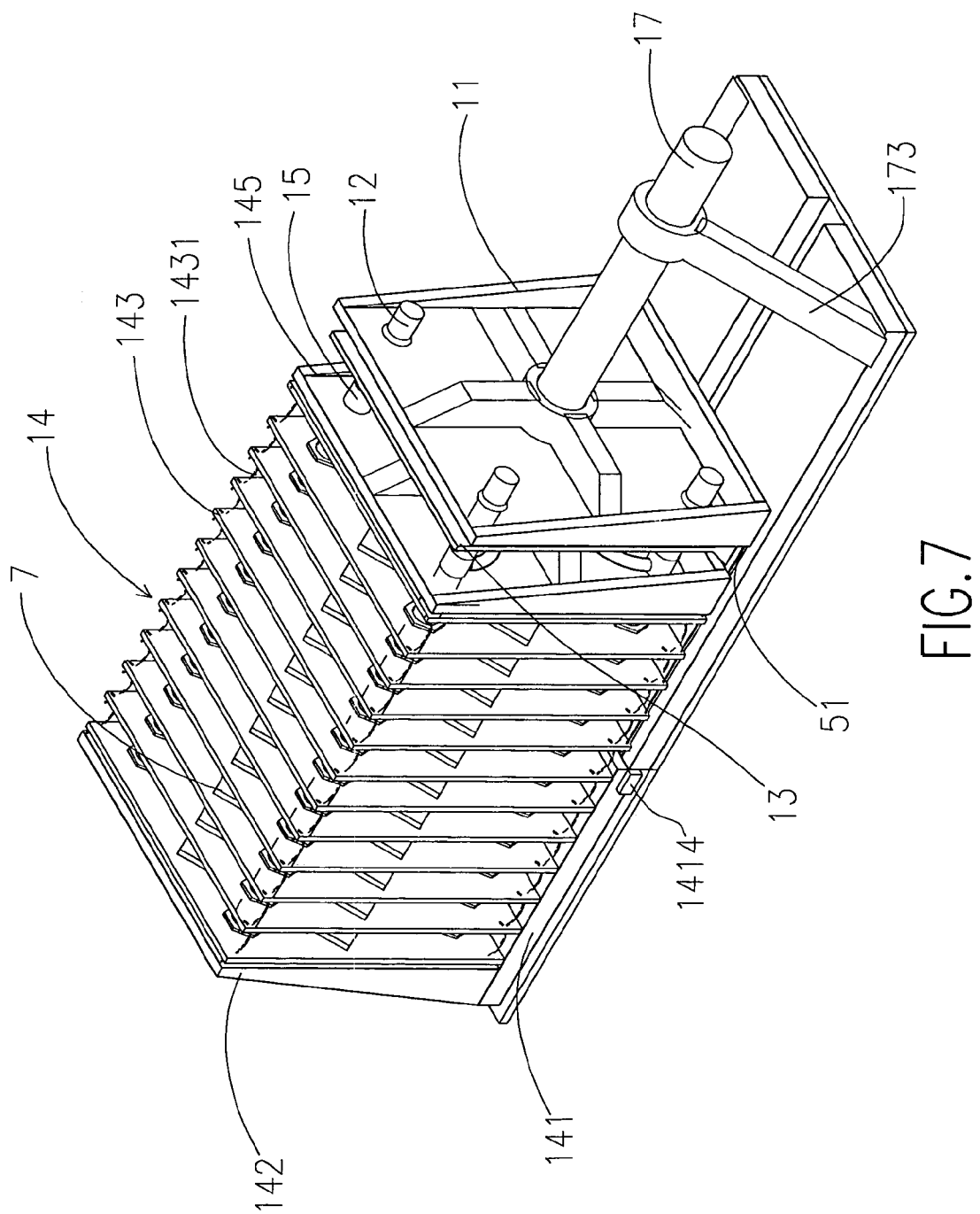
FIG. 7 shows one of the accordion fixture assemblies pulled apart by the pneumatic piston and moving to the assembly table.
Figure 8:
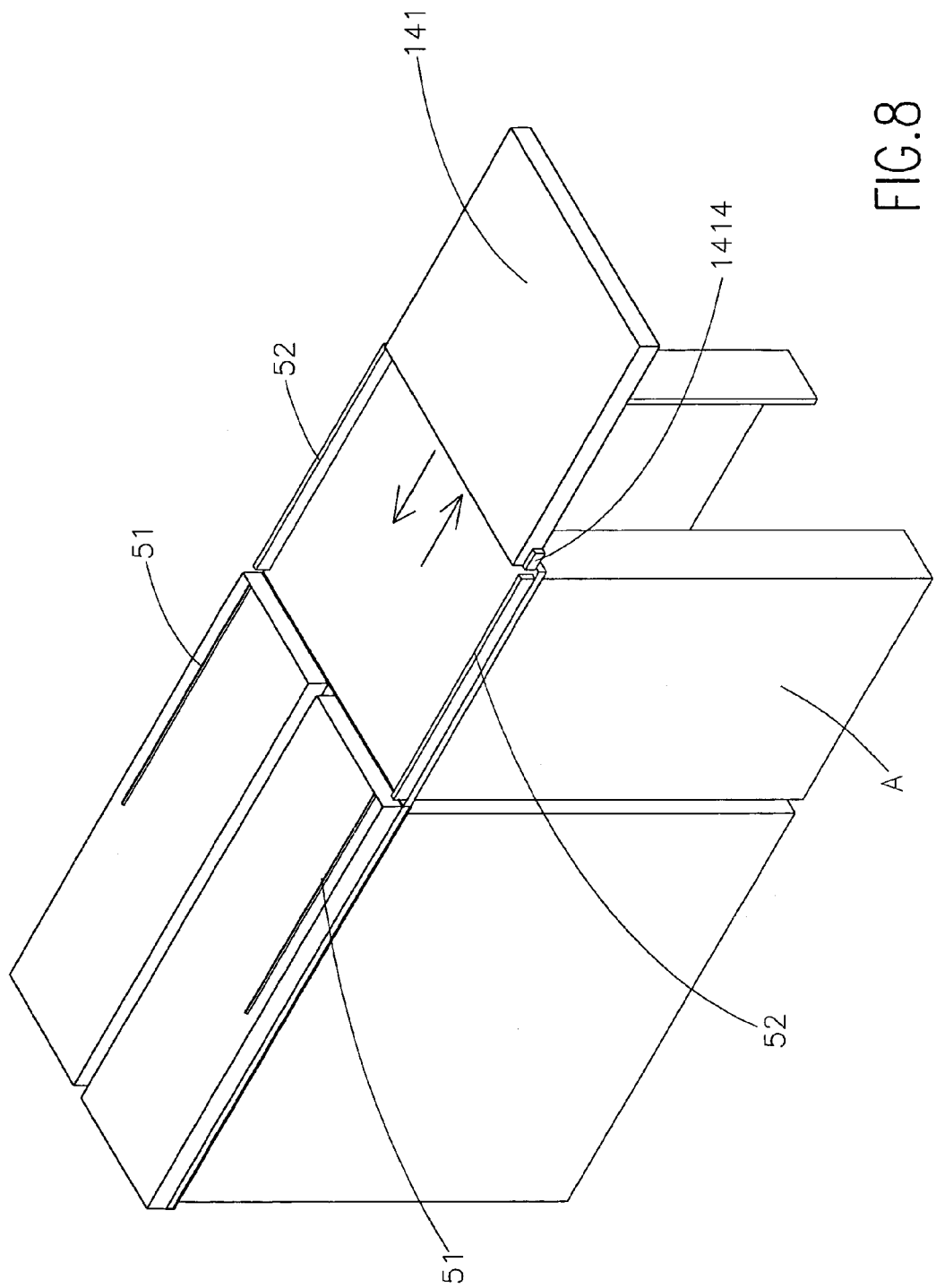
FIG. 8 shows the two guides in this system.

The production ESS system is shown in FIG. 1. It consists of a shaker (1), a head expander (2), a fast ramping insulated temperature chamber (22), two transporting trays (141), two PCB accordion fixture assemblies (14), a vacuum pump (32), a compressed air supply system (3) and a base table (A). Under the middle of this base table (A) is a shaker (1). On top of this shaker (1) is a head expander (2) that has an O-ring (24) on its perimeter. The design on both sides of the shaker chamber assembly is symmetrical; each side consists of an assembly table (5) and a system that will move, collapse and expand the PCB accordion fixture assembly (14). The system that will move, collapse, and expand the PCB accordion fixture assembly (14) consists of a fixed extension tubular shaft support plate (11) with the 4 extension tubular shafts (12) attached to the end support plate (11), a pneumatic cylinder (17), and a moveable end support (13). The movable extension tubular shaft support (13) which supports the 4 extension tubular shafts (12), is pushed by the pneumatic piston (171) in the pneumatic cylinder (17). The pneumatic cylinder (17) has the back end supported by a support structure (173) and the front end supported by the fixed extension tubular shaft support plate (11). In this invention design, there are two PCB accordion fixture assemblies (14) to hold the PCBs for ESS. Each PCB accordion fixture assembly (14) includes a transporting tray (141), a fixed end support (142) with 4 tubular shafts (144), a moveable end support (145), and a number of supporting plates (143). The fixed end support (142) is on one side of the transporting tray (141). There are 4 tubular shafts (144) attached to the fixed end support (142) and a number of supporting plates (143) are strung over the 4 tubular shafts (144). The moveable end support (145) sits on the opposite side of the transporting tray (141). The 4 holes on the moveable end support (145) are for passing the 4 tubular shafts (144), and in the middle of the moveable end support, there is a hole for the pneumatic piston (16) (see FIG. 5B) that is equipped with compressed air shaft collar locks (15). These are all connected by airlines to the compressed air supply system (3), which enables the shaft collar locks (15, 16) to lock or release. At the bottom edge of the supporting plates (143) mentioned previously, there are L shaped guides (142) to support the PCBs (7). Also, on the surface of the supporting plates there are several standoffs (1443) to simulate the mounting condition of the PCBs (7) in the actual product. Between the adjacent supporting plates (143) and the two outside plates with both the fixed and moveable end supports (142, 145), there are strings (1431) that connect them together. PCBs (7) for screening will first be put in between the supporting plates (143) in the PCB fixture accordion assembly (14) and are supported by the guides; then the pneumatic piston (171) in the pneumatic cylinder (17) pushes the moveable end support (145) to squeeze the support plates (143) together and the PCBs (7) are tightly sandwiched between the standoffs (1443) mounted on the supporting plates (143). (These standoffs (1443) can be cemented, welded, screwed on or attached by magnetic force to the support plates (143) to simulate the PCBs (7) actual mounting condition in the product. Compressed air from the airlines (311) comes out of the airholes in the bottom of the transporting tray (141) to float and facilitate the movement of the transporting plate (141). Also, at one side of the top surface of the transporting tray (141), there are vacuum holes (1411) connected to the vacuum lines (311) to pull a vacuum between the bottom surface of the moveable end support (145) and the top of the transporting tray (141) to tightly connect them together.

Figure 2A:
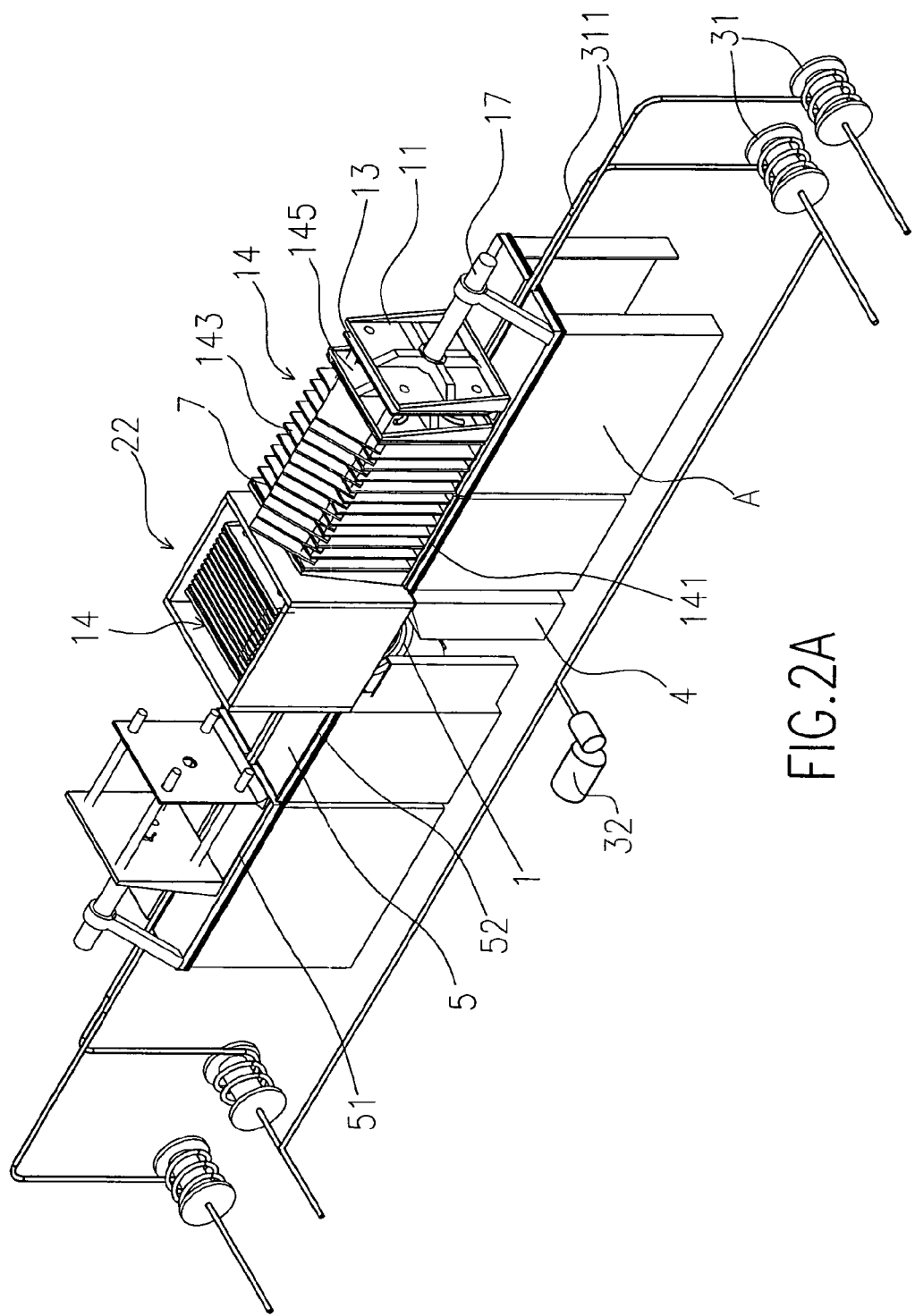
FIG. 2A shows the right-hand side accordion fixture assembly sitting on the assembly table, while the left hand side accordion fixture assembly is being moved into the fast ramping chamber for ESS.

How the Production Line ESS System Works:

FIG. 2A shows the first step of the process of this invention. The right hand side accordion fixture assembly (14) is at it's open position; that is, the moveable end support (145) is pulled to the open position by the pneumatic piston (171) in the pneumatic cylinder (117) through the connecting strings (1431), thus opening all the supporting plates (143) one by one. PCBs (7) ready for screening are inserted between the supporting plates (143) and are supported the L-shaped supports (1432) on the supporting plates (143). After the PCBs (7) are inserted, they can be connected to the power/diagnostic cables to facilitate operation and diagnositcs. Then, the pneumatic piston (171) in the pneumatic cylinder (117) pushes the moveable end support (145) to squeeze the PCBs (7) tightly onto the standoffs (1443). During the push action, the end of the pneumatic piston (171) is inserted in the compressed air-operated shaft collar lock (16) in the middle of the moveable end support (145). This shaft collar lock (16) consists of a metal cylinder and when filled with compressed air, it will grab onto the pneumatic piston (171) and tightly connect the moveable end support (145) to the pneumatic piston (171). The pneumatic piston (171) then pushes the moveable end support (145) as well as the movable extension tubular shaft support (13) to the left. The movable extension tubular shaft support (13) is pushed by the cross attachment (172) mounted on the piston. The movable end support (145) slides on two polytetrafluroethylene rails (51) mounted on the table under the pneumatic piston (171). In order to avoid the moveable end support (145) shaving the O-ring (1413) on the transporting tray (141), the polytetrafluroethylene rails are slightly above the O-ring (1413) that seals the bottom side of the movable end support (145). This O-ring (1413) is used to seal the space between the moveable end support (145) bottom and the transporting tray (141) top. The movable end support (145) is then locked into position on the four tubular shafts (144) by four compressed air-operated shaft collar locks (15). Every shaft collar lock (15) consists of a rubber cylindrical air bag (161) in a metal tube. The PCBs (7) are now pressed onto the standoffs (1443), which are attached to the support plates (143). The positions of the standoffs (1443) are exactly the same as they would be in the actual system design. The compressed air-operated collar lock (16) on the pneumatic piston (171) is unlocked to allow withdrawal of the piston, permitting the movable end support (145) to drop onto the transporting tray (141). The chamber (22) doors (221) are lifted upwards. The air valve (33) is opened, and the compressed air coming through the air line (311) and out the air holes (1412) under the transporting trays (141) floats the transporting trays (141) upward. The tray, guided by the two guides (52) on the side of the assembly table (5) and the 3 short guides (23) on the head expander (2) moves to the left until the stopper (1414) on the two sides of the transporting tray (141) contacts the short guides (23) on the head expander (2). This brings the transporting tray into the correct position.

Figure 2B:
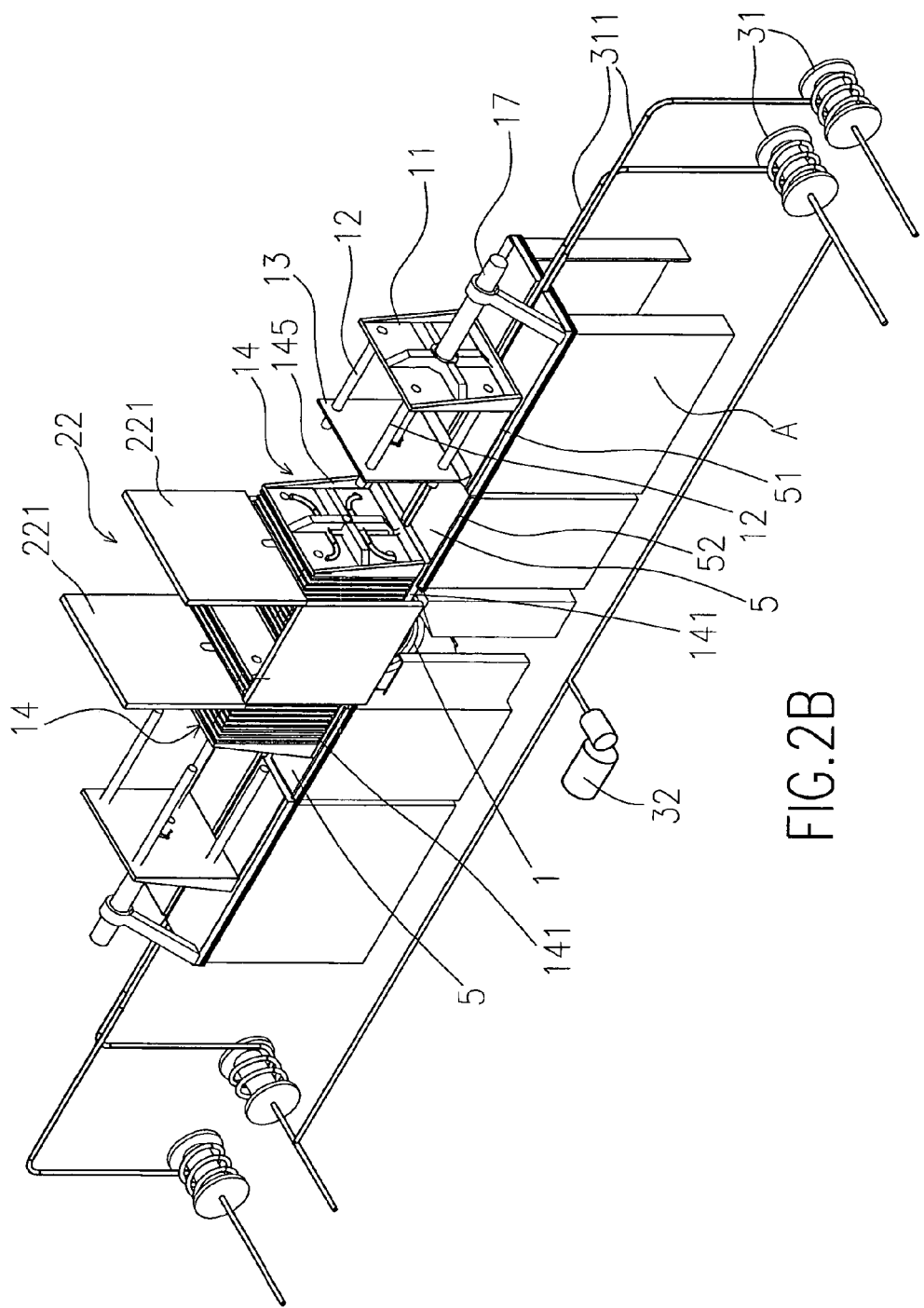
FIG. 2B shows the right hand side accordion fixture assembly being moved to the left into the fast ramping temperature chamber, and the left hand side accordion fixture assembly moving out of the chamber to the left side assembly table.

At the same time, the PCBs (7) that have completed the ESS process in the PCB accordion fixture assembly (14) are moved out from the fast ramping temperature chamber (22) along the four tubular shafts (144) that are connected to the four extension shafts (12) and rest on the left hand side assembly table (5) (see FIG. 2B). Each of the transporting trays (141) are connected by to a set of air lines, vacuum lines, and cables (311) necessary to operate the units under test which are bundled together. The cable/hose bundle (311) is pulled out through the chamber port (222) on the movable chamber side door (221). The cable/hose set (311) on the left is coiled onto the spring loaded spools (31) as the left transport tray (141) is moving onto the left hand side assembly table (5). The cable hose set (311) on the right is unfurled from the spring loaded spools (31) as the right transporting tray (141) is moving into the chamber (22).

Figure 2C:
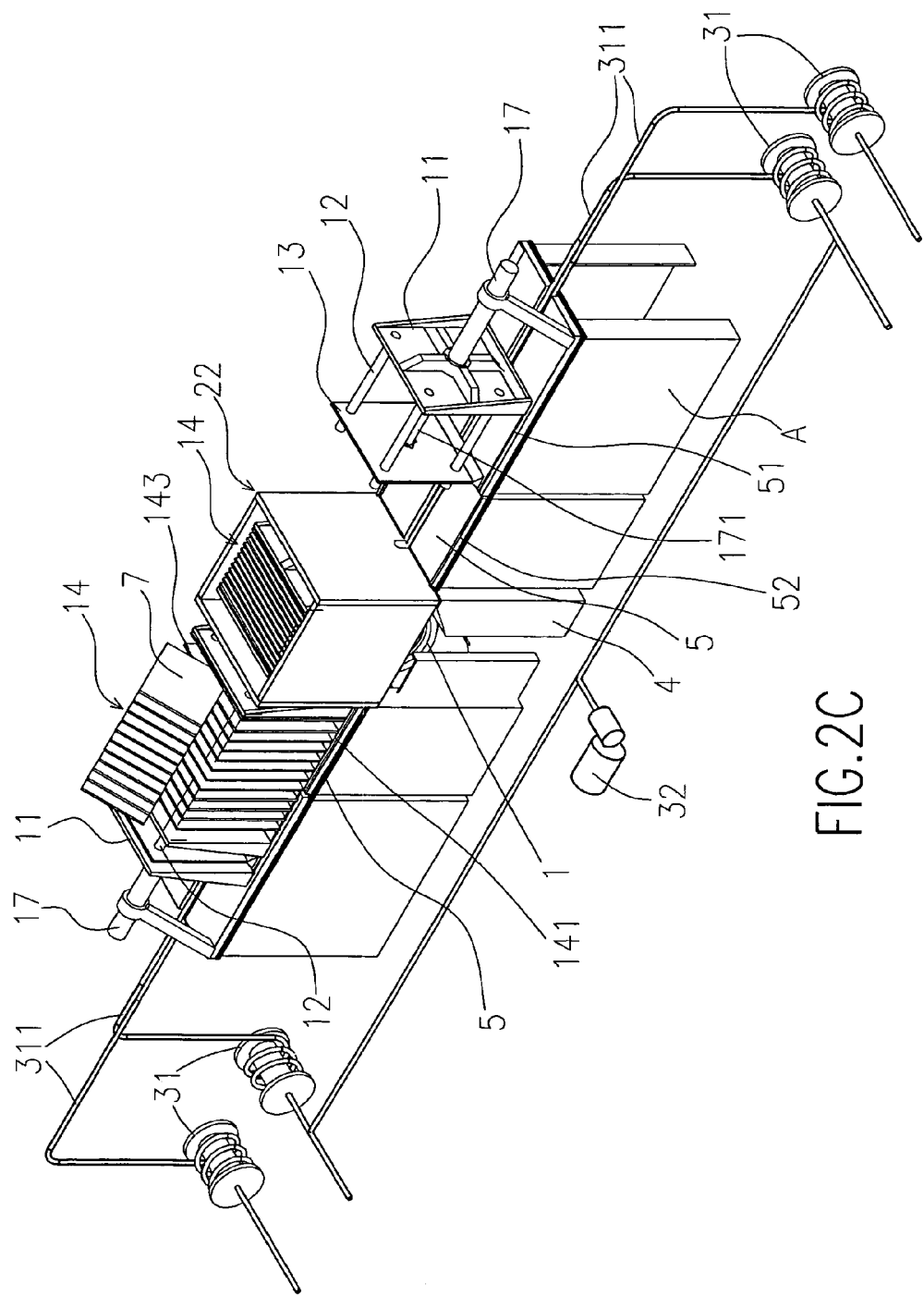
FIG. 2C shows the left hand side accordion fixture assembly being moved to the left side assembly table, while the right hand side accordion fixture assembly is moved into the fast ramping temperature chamber ready for ESS.
Figure 2D:
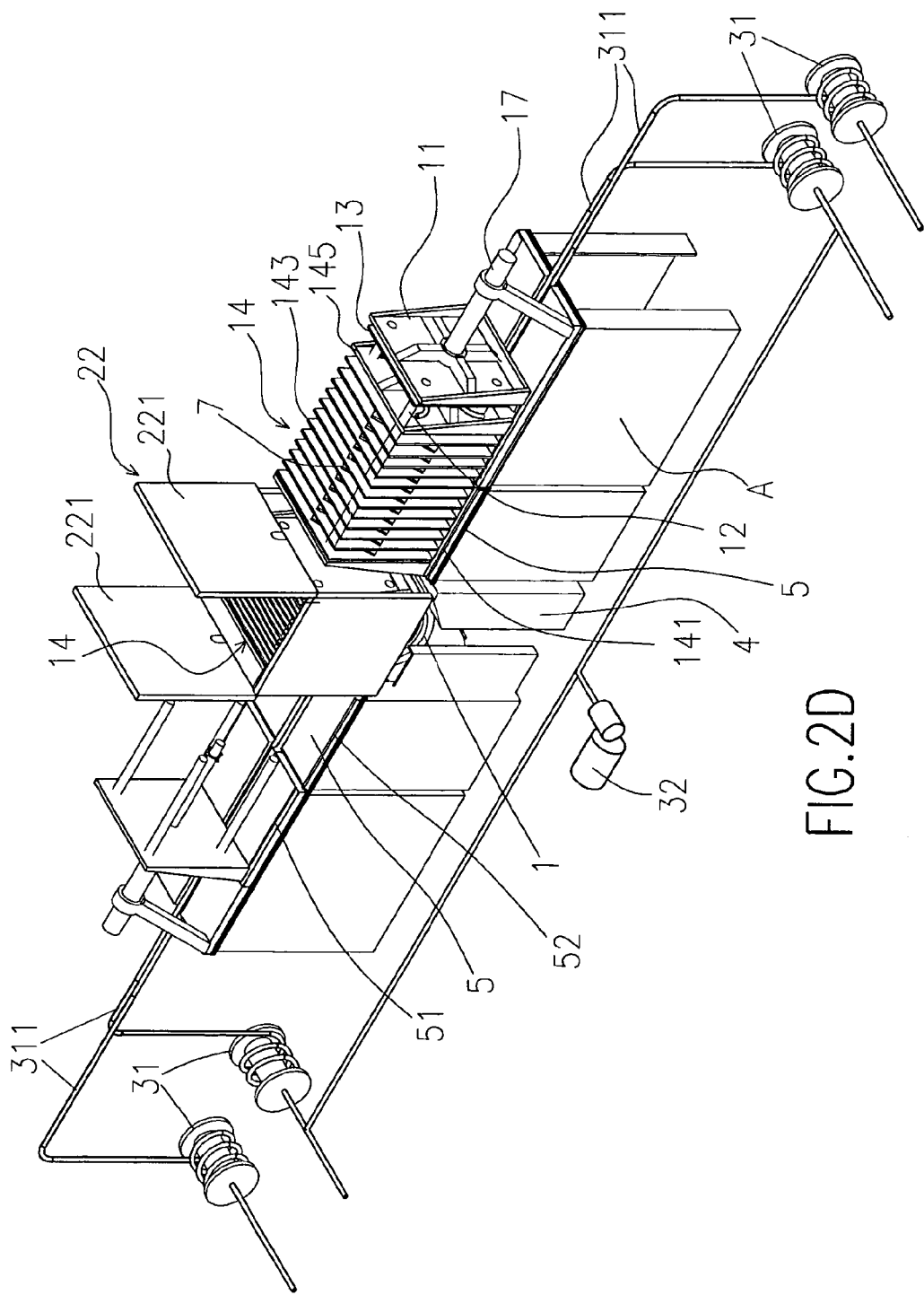
FIG. 2D shows the right hand side accordion fixture assembly being moved onto the right side assembly table, ready to accept a new set of units for ESS.

The right transporting tray (141) is now inside the fast ramping temperature chamber (22) (see FIG. 2C). The air valve (33) shuts off the air and allows the right transporting tray (141) to gently come down onto the O-rings (24) on the G-10 insulating sheet (21) mounted on the shaker head expander (2). The left side pneumatic piston (171) in the pneumatic cylinder (17) is extended to lock onto the shaft collar locks (16) on the movable end support (145) on the PCB accordion fixture (14) resting on the left hand side assembly table (5). Compressed air is turned on to the piston collar lock (2), thus locking the piston to the movable anchor end support (145). At the same time the four tubular shaft collar locks (15) are released to unlock the moveable end support (145) from the tubular shafts (144). The pneumatic piston (171) is then pulled back with the movable end support (145) and the movable extension tubular shaft support (13) to separate each supporting plates (143) with strings (1431) (see FIG. 5A). The support plates (143) are now strung on both the tubular shafts (144) and the extension tubular shafts (12). The four holes on the honeycomb support plates (143) are lined by a threaded sleeve and tightened to the plate with a nut in order to facilitate the sliding of the supporting plates (143) on the shafts (144, 12) (see FIG. 5C). Another way to separate the supporting plates (143) is by stringing springs on the tubular shafts (144) between the supporting plates (143) which will push the supporting plates (143) apart and allow for the loading or unloading of the PCBs (7).

The PCBs (7) in the left PCB accordion fixture assembly (14) that have already completed the ESS process are removed and a new batch of PCBs (7) is loaded in to the PCB accordion fixture assembly (14). While the boards are being loaded into the left PCB accordion fixture assembly (14), the right PCB accordion fixture assembly (14) is now sitting in the chamber (22) ready to undergo ESS. The vacuum pump (32) is turned on by opening the vacuum valve (34) to pull vacuum between the bottom of the movable end support (145) and the top surface of the transporting tray (141) through the holes (1411) on the top face of the transporting tray (141), thus securing the movable end support (145) to the transporting tray (141). At the same time, the vacuum pump (32) is also pulling vacuum between the transporting tray's (141) bottom surface and the shaker head expander's (2) top surface to securely connect the transporting tray (141) and the shaker (1) together. The chamber doors (221) are closed. The liquid nitrogen valve (223) is opened. The PCBs (7) inside the chamber (22) are rapidly cooled by the liquid nitrogen. The sealing between the chamber (22) and the head expander (2) is accomplished with several pieces of foam (8) as shown in FIGS. 4A & 4B. The left side foam (8) is attached to the chamber side door (221). One foam on the right side (8) is attached to the slanted oil table (4), and the other is sitting on top of the slanted oil table (4). The chamber (22) also has a vent (227) on the top to vent excess nitrogen gas. In order to save energy the inside surface of the chamber (22) is insulated and the temperature of the chamber (22) structure remains relatively unchanged. When the specified low temperature is reached, the shaker (1) is turned on to vibrate the PCBs (7) at a skewed angle in operating or non-operating modes. The skewed head expander (2) is supported by a slanted oil slip table (4) to avoid applying side load to the shaker (1). Also, the vibration can be horizontal or vertical, as long as it is at a skewed angle with the PCBs, thus introducing force on all three axes to the PCBs (FIGS. 4A & 4B). Vibration can also be applied only in one direction at a time, but this would not be as effective and would take much longer to screen, since all 3 axes must be tested. After the cold cycle vibration is done, the liquid nitrogen valve (223) is turned off and the chamber heaters (224) are turned on to heat the PCBs (7) to the specified high temperature at a fast ramp rate. The temperature is made uniform by the fans (225) in the chamber (22). When high temperature is reached and stabilized, the shaker (1) is then turned on to vibrate the PCBs (7) again while they are being operated. This process will also work if heat is applied first and then cooling. If the PCBs (7) were operating during the screening process, any defective boards identified by the operational diagnostics should be eliminated from use in the final product. If the operation of the PCBs (7) during the screening process is too difficult, the PCBs (7) can be checked out before and after the screening process. After a diagnostic check, all defective boards should be eliminated from use in the final product. (However, boards with intermittent failures will not be identified, if not operated during the test.) The chamber doors (221) are opened again and the air valve (33) is turned on. The transporting tray (141) is lifted by the compressed air and transporting tray (141) are moved manually to the right so that the right transporting tray is on the assembly table (5) and the left transporting tray (141) with the new batch of PCBs (7) is inside the chamber (22). The ESS process is applied to these PCBs (7) on the left transporting tray (141). The right transporting tray (141) has moved to the right assembly table (5), the PCB accordion fixture assembly (14) is pulled apart by the pneumatic piston (171) as described previously, screened boards are taken out, and a new batch of PCBs (7) is loaded into the PCB accordion fixture assembly (14), ready for the ESS process. The whole process then repeats again.

What the invention claimed is:

1. A production line environmental stress screening system for an object comprising:

a base table having opposing ends including a head expander in a center of said base table;

a pair of assembly tables on either side of the head expander;

a shaker in the center of the base table, said shaker being positioned below said head expander and connected to the head expander;

a fast ramping temperature chamber mounted on a top of the head expander, said chamber including a pair of doors being movable upward and downward on a side of said chamber for insertion and removal of said object with respect to said chamber, said chamber equipped with a liquid nitrogen unit to cool said chamber and heaters to heat the chamber at fast ramp rates;

a set of accordion fixture assemblies, said assemblies movable between the assembly tables and the head expander and including a transporting tray, said transporting tray including on a side a fixed end support plate with a plurality of tubular shafts attached thereto, said tubular shafts including a number of support plates mounted thereon and having an end with a movable end support plate, said movable end support plate including a plurality of holes to allow the movement of the support plates on the tubular shafts, and a metal cylinder in a middle of the moveable end support plate to accommodate a shaft collar lock for a pneumatic piston;

a collapsing and extending system being located on each end of the base table and including both fixed and movable support plates which support a plurality of extension shafts, said fixed support plate supporting a pneumatic cylinder, the piston of the pneumatic cylinder engages the movable shaft supports of said extending system;

wherein said stress screening system allows a relatively large number of objects to be sandwiched between the supporting plates in the accordion fixture assembly whereby while one accordion assembly is pushed into the temperature chamber for high/low temperature and vibration screening, another accordion assembly is moved out from the chamber to the assembly table, said piston then retracts and pulls on the moveable end support plate and the moveable extension shaft and opens the accordion assembly thereby opening the supporting plate and moving said plate onto said tubular shafts and the extension shafts; said objects that have completed an environmental stress screening process are removed and a new set of PCBs are inserted, and the piston pushes the movable support plate and the movable extension shaft support plate to a predetermined location whereby said objects are squeezed together in preparation for environmental stress screening.

2. The production line environmental stress screening system as claimed in claim 1, further comprising; a plurality of air holes located in a bottom of each transporting tray; and a plurality of vacuum holes surrounded by an O-ring on a top of said transporting tray.

3. The production line environmental stress screening system as claimed in claim 1, further comprising; an O-ring on a periphery of the head expander.

4. The production line environmental stress screening system as claimed in claim 1, wherein said plurality of holes on the moveable end support and a hole in a middle of the pneumatic piston further include shaft collar locks inserted therein.

5. The production line environmental stress screening system as claimed in claim 1, further comprising; V-shaped angle guides, said V-shaped angle guides being located on said supporting plates in said PCB accordion assembly and used to support the objects.

6. The production line environmental stress screening system as claimed in claim 1, further comprising, a plurality of strings connecting said supporting plate in the accordion fixture assembly, the fixed end support and the moveable end support.

7. The production line environmental stress screening system as claimed in claim 1, further comprising; a compressed air line, a vacuum line and electrical/diagnostic cables, said air line, vacuum line and electrical/diagnostic cables being coiled onto a plurality of spring loaded spools.

8. The production line environmental stress screening system as claimed in claim 1, wherein both doors on the fast ramping temperature chamber include ports to accommodate the lines and cables of the accordion fixture assembly.

9. The production line environmental stress screening system as claimed in claim 1, wherein the head expander is supported in a skewed direction by an oil pressured slip table to avoid side movement.

10. The production line environmental stress screening system as claimed in claim 1, further comprising; a set of side guides, said side guides being used to guide the movement of the transporting plate.

11. The production line environmental stress screening system as claimed in claim 1, further comprising; short guides on a side of the head expander to guide the accordion fixture assembly into the fast ramping temperature chamber; and stoppers on the transporting tray.

12. The production line environmental stress screening system as claimed in claim 1, wherein said accordion fixture assembly includes a set of intermediate plates having a plurality of standoffs on both sides of the intermediate plates and a pair of end plates having a plurality of standoffs on one side of said endplate.

13. The production line environmental stress screening system as claimed in claim 12, wherein the standoffs are glued or welded onto the support plates for the accordion fixture assembly.

14. The production line environmental stress screening system as claimed in claim 12, wherein the standoffs are screwed onto the support plates for the accordion fixture assembly.

15. The production line environmental stress screening system as claimed in claim 12, wherein the standoffs are attached to the support plates for the accordion fixture assembly by magnetic force.

16. The production line environmental stress screening system as claimed in claim 1, further comprising; a plurality of springs strung on the tubular shafts.

* * * * *